(12) United States Patent
Suh et al.

(10) Patent No.: US 9,929,315 B2
(45) Date of Patent: Mar. 27, 2018

(54) LED CHIP RESISTANT TO ELECTROSTATIC DISCHARGE AND LED PACKAGE INCLUDING THE SAME

(71) Applicant: Seoul Viosys Co., Ltd., Ansan-si (KR)

(72) Inventors: Duk Il Suh, Ansan-si (KR); Kyoung Wan Kim, Ansan-si (KR); Yeo Jin Yoon, Ansan-si (KR); Sang Won Woo, Ansan-si (KR); Shin Hyoung Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/724,436

(22) Filed: May 28, 2015

(65) Prior Publication Data

US 2015/0318443 A1   Nov. 5, 2015

Related U.S. Application Data

(63) Continuation of application No. 14/181,094, filed on Feb. 14, 2014, now abandoned.

(30) Foreign Application Priority Data

| Feb. 15, 2013 | (KR) | ......................... 10-2013-0016458 |
| Apr. 29, 2013 | (KR) | ......................... 10-2013-0047383 |
| Jul. 2, 2013  | (KR) | ......................... 10-2013-0077234 |

(51) Int. Cl.
*H01L 29/15* (2006.01)
*H01L 33/38* (2010.01)
(Continued)

(52) U.S. Cl.
CPC ............ *H01L 33/387* (2013.01); *H01L 27/15* (2013.01); *H01L 29/861* (2013.01);
(Continued)

(58) Field of Classification Search
CPC ..... H01L 33/42; H01L 33/387; H01L 33/382; H01L 33/38; H01L 33/32;
(Continued)

(56) References Cited

U.S. PATENT DOCUMENTS 7,531,841 B2    5/2009 Ko et al.
2005/0253151 A1 11/2005 Sakai
(Continued)

FOREIGN PATENT DOCUMENTS

CN  1652359    8/2005
CN  102263120  11/2011
(Continued)

OTHER PUBLICATIONS

International Search Report dated Jun. 5, 2014, in International Patent Application PCT/KR2014/001279.
(Continued)

*Primary Examiner* — Vongsavanh Sengdara
(74) *Attorney, Agent, or Firm* — Perkins Coie LLP

(57) ABSTRACT

A light emitting diode chip and a light emitting diode package including the same. The light emitting diode chip includes a substrate, a light emitting diode section disposed on the substrate, an inverse parallel diode section disposed on the substrate and connected inversely parallel to the light emitting diode section. In the light emitting diode chip, the light emitting diode section is disposed together with the inverse parallel diode section.

28 Claims, 7 Drawing Sheets

(51) Int. Cl.
  *H01L 27/15* (2006.01)
  *H01L 33/32* (2010.01)
  *H01L 33/42* (2010.01)
  *H01L 33/14* (2010.01)
  *H01L 29/861* (2006.01)
  *H01L 33/20* (2010.01)

(52) U.S. Cl.
  CPC ............ *H01L 33/145* (2013.01); *H01L 33/20* (2013.01); *H01L 33/32* (2013.01); *H01L 33/382* (2013.01); *H01L 33/42* (2013.01); *H01L 33/38* (2013.01); *H01L 2224/48091* (2013.01); *H01L 2224/48247* (2013.01); *H01L 2224/48257* (2013.01); *H01L 2933/0091* (2013.01)

(58) Field of Classification Search
  CPC ... H01L 2933/0091; H01L 2924/00014; H01L 29/861; H01L 27/15; H01L 2224/48257; H01L 2224/48247; H01L 2224/4809
  USPC .......................................................... 257/76
  See application file for complete search history.

(56) References Cited

U.S. PATENT DOCUMENTS

| | | | |
|---|---|---|---|
| 2006/0163604 A1* | 7/2006 | Shin | H01L 27/15 257/103 |
| 2008/0083929 A1 | 4/2008 | Fan | |
| 2010/0019253 A1* | 1/2010 | Kim | H01L 27/15 257/88 |
| 2010/0072494 A1 | 3/2010 | Lee | |
| 2010/0140646 A1* | 6/2010 | Joung | H01L 33/145 257/98 |
| 2010/0213496 A1 | 8/2010 | Chen | |
| 2011/0049472 A1 | 3/2011 | Kim | |
| 2012/0025244 A1 | 2/2012 | Suh | |
| 2012/0161176 A1* | 6/2012 | Heo | H01L 33/46 257/98 |
| 2013/0134462 A1* | 5/2013 | Kim | H01L 33/08 257/98 |
| 2013/0146934 A1 | 6/2013 | Lin | |
| 2013/0234192 A1* | 9/2013 | Kim | H01L 33/38 257/98 |

FOREIGN PATENT DOCUMENTS

| | | |
|---|---|---|
| JP | 2004-172189 | 6/2004 |
| JP | 5045248 | 10/2012 |
| KR | 10-2007-0099269 | 10/2007 |
| KR | 10-2012-0053990 | 5/2012 |
| KR | 10-2012-0124640 | 11/2012 |

OTHER PUBLICATIONS

Office Action, Chinese Patent Application No. 201480008779, dated Nov. 30, 2016, 9 pages.

* cited by examiner

[Fig. 1]
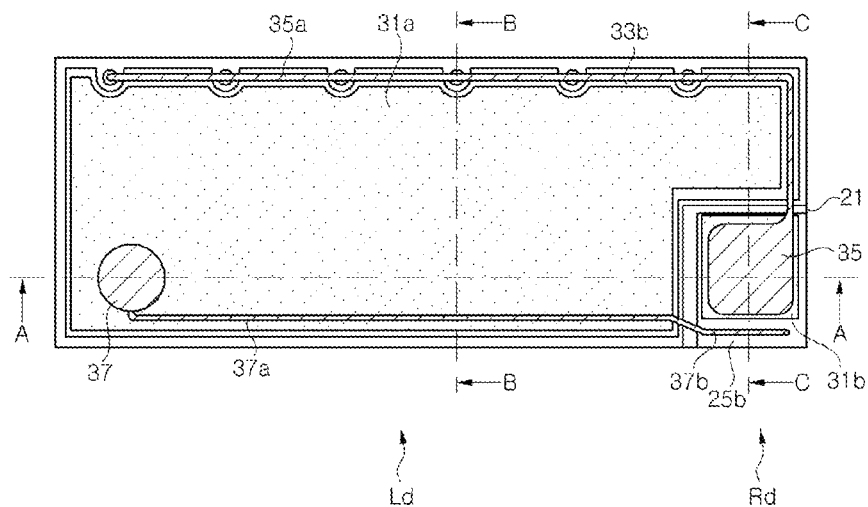
[Fig. 2]
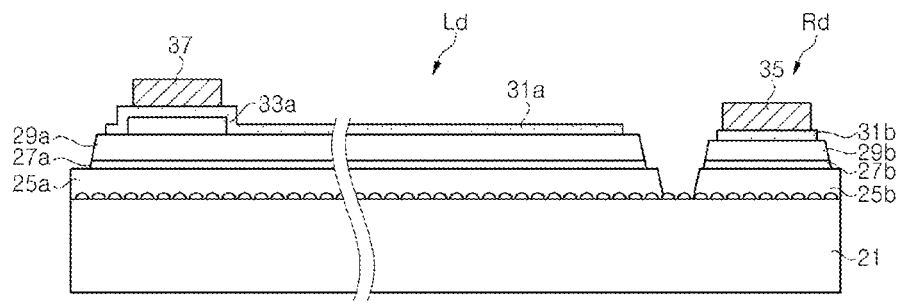
[Fig. 3]
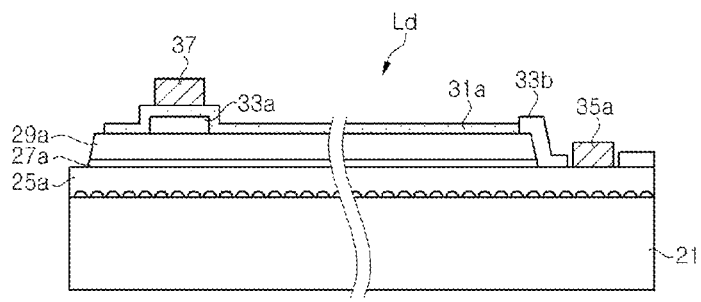

[Fig. 4]
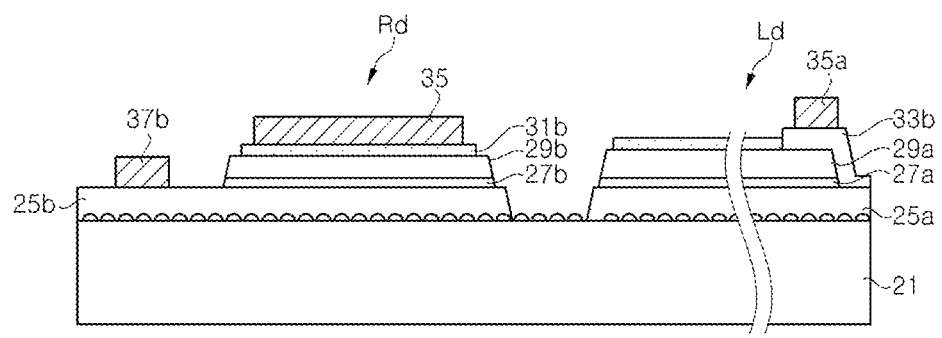
[Fig. 5]
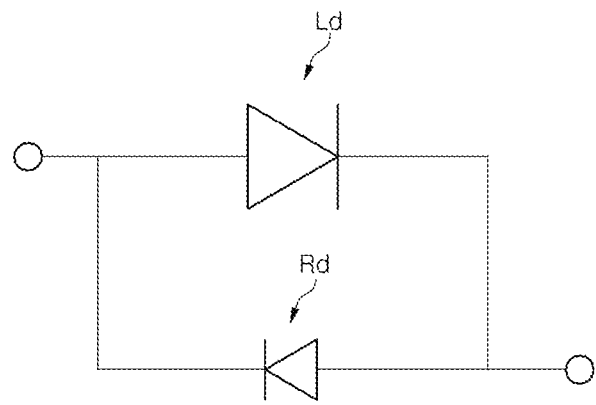

[Fig. 6(a)]
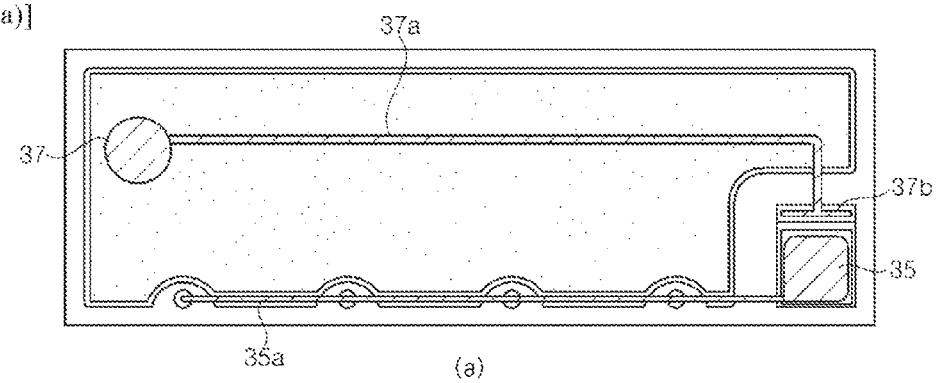
[Fig. 6(b)]
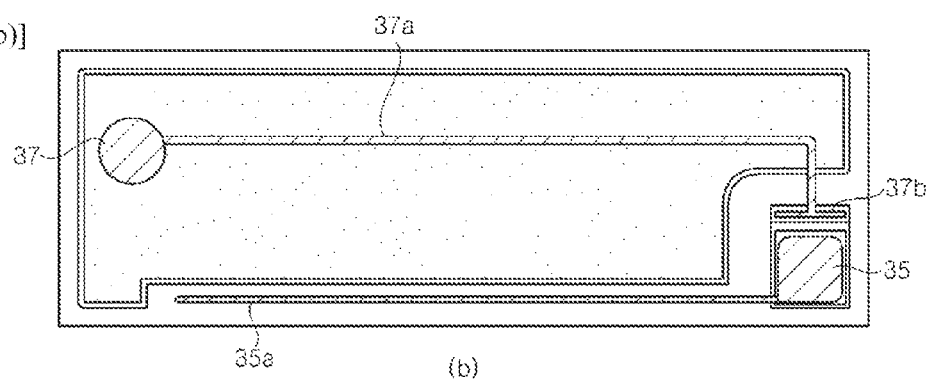
[Fig. 7]
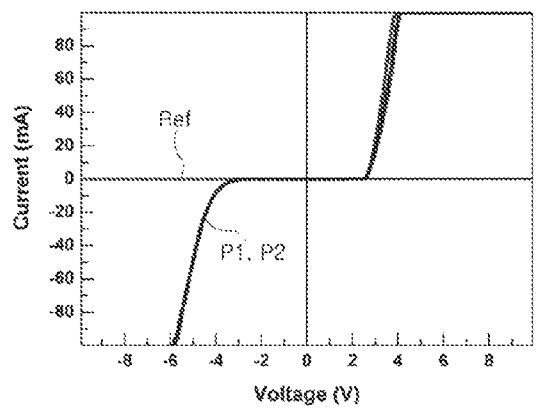

[Fig. 8]
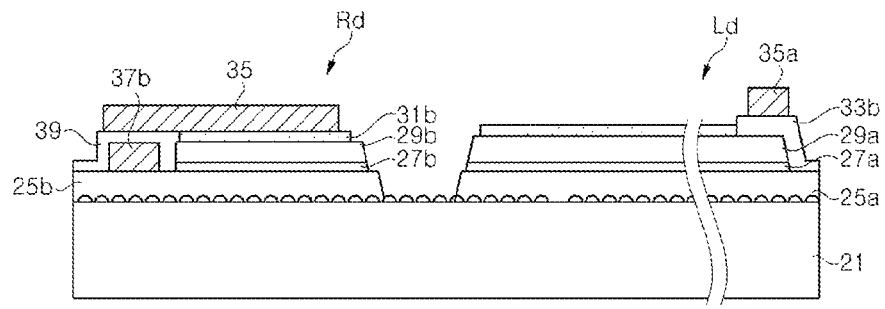
[Fig. 9]
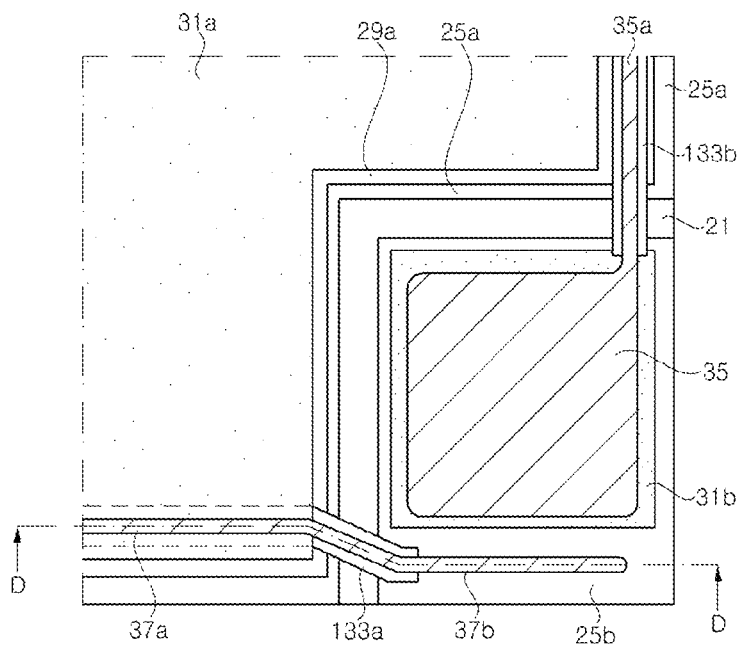

[Fig. 10]
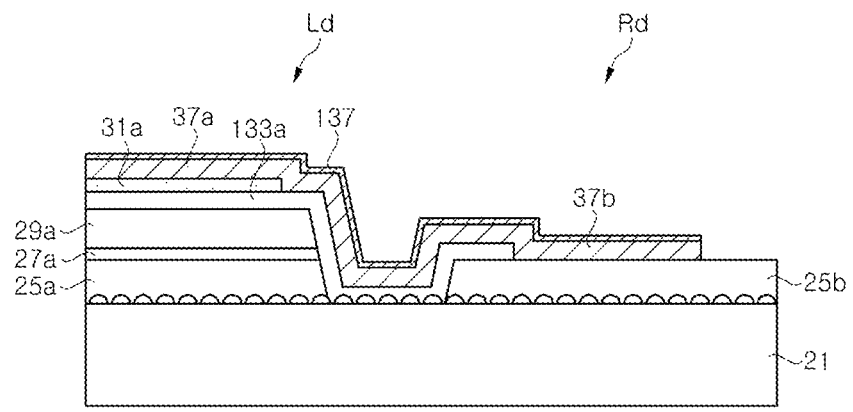
[Fig. 11]
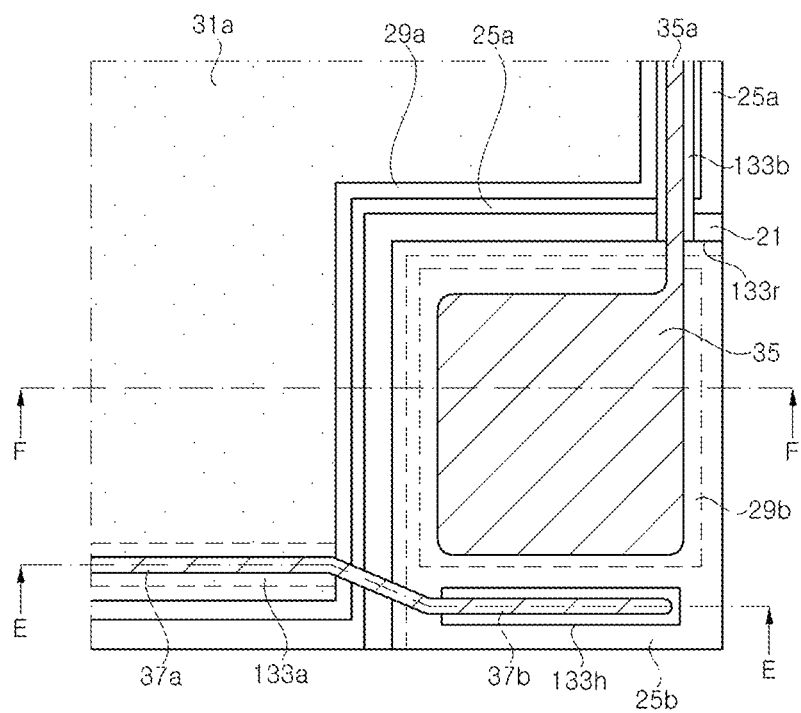

[Fig. 12]
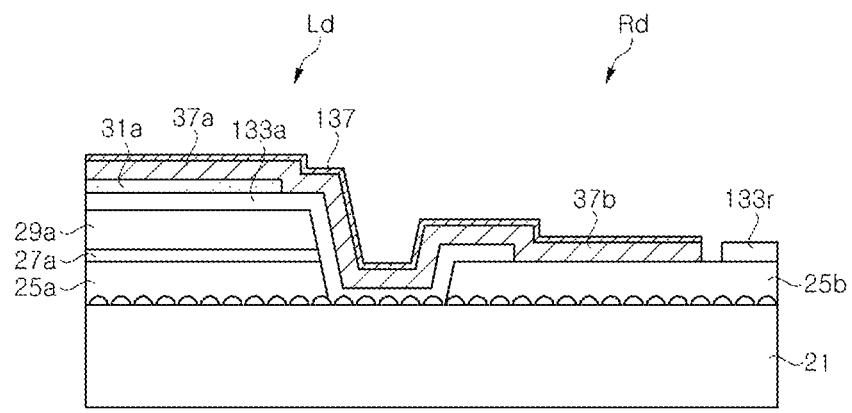
[Fig. 13]
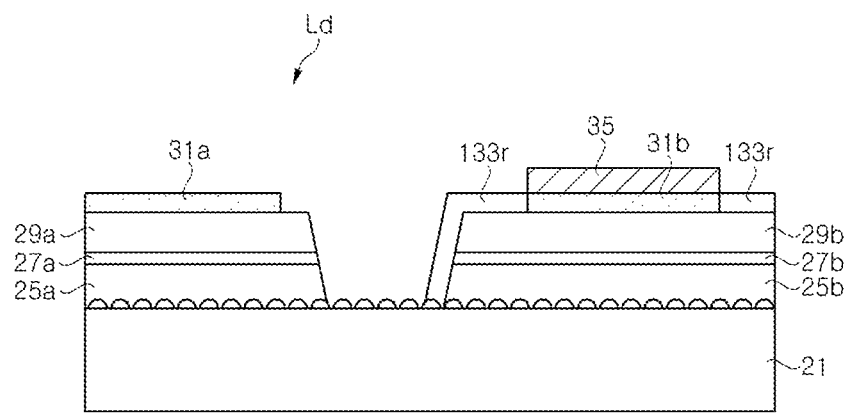
[Fig. 14]
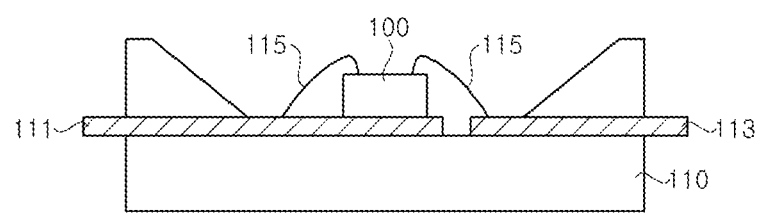

[Fig. 15]
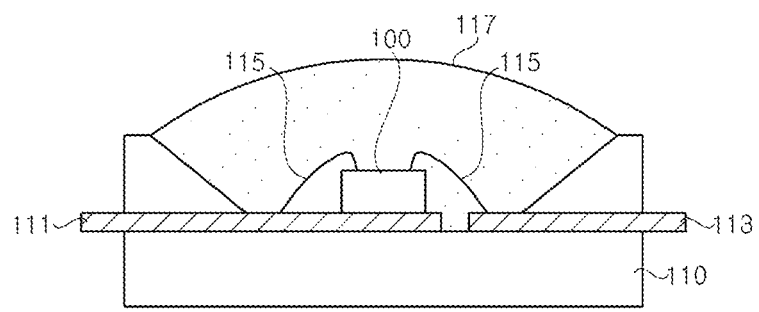

LED CHIP RESISTANT TO ELECTROSTATIC DISCHARGE AND LED PACKAGE INCLUDING THE SAME

CROSS-REFERENCE TO RELATED APPLICATIONS

This application is a continuation of, and claims priority from and the benefits to U.S. patent application Ser. No. 14/181,094, filed on Feb. 14, 2014, which further claims priorities from and the benefits of Korean Patent Application No. 10-2013-0016458, filed on Feb. 15, 2013, Korean Patent Application No. 10-2013-0047383, filed on Apr. 29, 2013, and Korean Patent Application No. 10-2013-0077234, filed on Jul. 2, 2013, all of which are hereby incorporated by reference for all purposes as if fully set forth herein.

BACKGROUND

Field

Exemplary embodiments of the present invention relate to a light emitting device, and more particularly, to a light emitting diode chip that is resistant to electrostatic discharge, and a light emitting diode package including the same.

Discussion of the Background

Generally, GaN-based compound semiconductors are formed by epitaxial growth on a sapphire substrate, which has a similar crystal structure and lattice parameter thereto, in order to reduce lattice defects. However, epitaxial layers grown on the sapphire substrate may have many types of crystal defects, such as V-fits, threading dislocations, and the like. When high voltage static electricity is applied to a light emitting diode from outside, current is concentrated in crystal defects in the epitaxial layers, thereby causing diode breakdown.

Recently, the number of applications of high brightness/high output light emitting diodes (LEDs) has increased, not only to backlight units of LED TVs, but also to luminaries, automobiles, electric signboards, facilities, and the like. Accordingly, there is an increasing demand for the protection of light emitting devices against static electricity.

For LEDs, it is desirable to secure a semi-permanent lifespan using an ESD protection device having excellent electric reliability. It is very important to secure reliability of LEDs with respect to electrostatic discharge (ESD), electrical fast transient (EFT), which refers to sparks occurring in a switch, and electrical surges resulting from lightning and the like.

Generally, when packaging a light emitting diode, a separate Zener diode is mounted together with the light emitting diode to prevent electrostatic discharge. However, the Zener diode is expensive and several processes are used for mounting, thereby increasing manufacturing costs, as well as the number of processes for packaging the light emitting diode. Moreover, because the Zener diode is disposed near the light emitting diode in an LED package, luminous efficacy of the package is reduced as a result of absorption of light by the Zener diode, thereby deteriorating light yield of the LED package.

On the other hand, various attempts have been made to provide a light emitting diode chip resistant to ESD using a stacked structure of epitaxial layers in the light emitting diode chip. For example, a super lattice layer may be disposed between an n-type semiconductor layer and an active layer. With this structure, the super lattice layer can reduce lattice defects in the active layer, thereby providing a light emitting diode chip resistant to ESD. However, this technique still does not provide good yield.

The above information disclosed in this Background section is only for enhancement of understanding of the background of the invention and, therefore, it may contain information that does not constitute prior art.

SUMMARY OF THE INVENTION

Exemplary embodiments of the present invention provide a light emitting diode chip having high resistance to electrostatic discharge at a chip level, and a light emitting diode package including the same.

Exemplary embodiments of the present invention also provide a light emitting diode chip having high resistance to electrostatic discharge, and which is free from reduction in light output or an increase in forward voltage, and a light emitting diode package including the same.

Exemplary embodiments of the present invention also provide a light emitting diode chip having high resistance to electrostatic discharge, and which exhibits improved luminous efficacy at the chip level and/or package level, and a light emitting diode package including the same.

Additional features of the invention will be set forth in the description which follows, and in part will become apparent from the description, or may be learned from practice of the invention.

An exemplary embodiment of the present invention discloses a light emitting diode chip including: a substrate; a light emitting diode section disposed on the substrate; and an inverse parallel diode section disposed on the substrate and connected inversely parallel to the light emitting diode section. In the light emitting diode chip, the light emitting diode section is disposed together with the inverse parallel diode section, whereby the light emitting diode chip exhibits high resistance to electrostatic discharge.

The substrate may be a growth substrate capable of growing a nitride semiconductor layer thereon, and may be, for example, a patterned sapphire substrate (PSS).

Each of the light emitting diode section and the inverse parallel diode section may include a first conductivity type nitride semiconductor layer; a second conductivity type nitride semiconductor layer; and an active layer disposed between the first conductivity type nitride semiconductor layer and the second conductivity type nitride semiconductor layer. The light emitting diode section and the inverse parallel diode section may have the same stack structure, and may be formed using epitaxial layers which are grown together through the same growth process. On the other hand, the second conductivity type nitride semiconductor layer of the light emitting diode section and the second conductivity type nitride semiconductor layer of the inverse parallel diode section may have different thicknesses. For example, the second conductivity type nitride semiconductor layer of the inverse parallel diode section may have a smaller thickness than that of the light emitting diode section. With this structure, the inverse parallel diode section may have a lower height than the light emitting diode section.

The light emitting diode chip may further include a first electrode pad and a second electrode pad, wherein the first electrode pad may be disposed on the inverse parallel diode section, and the second electrode pad may be disposed on the light emitting diode section. Because the first electrode pad is disposed on the inverse parallel diode section, it is possible to secure a larger activation area than in the case where the first electrode pad is formed on the light emitting diode section.

The light emitting diode chip may further include a first extension extending from the first electrode pad; and a second extension extending from the second electrode pad. The first extension may be electrically connected to the first conductivity type nitride semiconductor layer of the light emitting diode section, and the second extension may be electrically connected to the first conductivity type nitride semiconductor layer of the inverse parallel diode section.

The first electrode pad and the second extension may be horizontally separated from each other. A portion of the first electrode pad may be disposed on the second extension electrically connected to the first conductivity type nitride semiconductor layer of the inverse parallel diode section. In addition, the light emitting diode chip may further include an isolation layer insolating the first electrode pad from the second extension.

In addition, the first extension may be connected to the first conductivity type nitride semiconductor layer at a plurality of points on the light emitting diode section.

The first extension may pass through an upper portion of the second conductivity type nitride semiconductor layer of the light emitting diode section, and the first extension may be electrically insulated from the second conductivity type nitride semiconductor layer by the insulation layer. Alternatively, the first extension may be linearly connected to the first conductivity type nitride semiconductor layer of the light emitting diode section.

The light emitting diode chip may further include a second transparent electrode layer disposed between the first electrode pad and the second conductivity type nitride semiconductor layer of the inverse parallel diode section. The second transparent electrode layer helps the first electrode pad to electrically connect to the second conductivity type nitride semiconductor layer. When the first electrode pad is electrically connected to the second conductivity type nitride semiconductor layer, the second transparent electrode layer may be omitted.

The light emitting diode chip may further include a first transparent electrode layer connected to an upper surface of the second conductivity type nitride semiconductor layer of the light emitting diode section. The second electrode pad may be disposed on the first transparent electrode layer. In addition, the light emitting diode chip may further include a current blocking layer disposed under a region for the first transparent electrode layer below the second electrode pad.

The light emitting diode chip may further include a current blocking layer disposed under a region for the first transparent electrode layer below the second extension.

The light emitting diode chip may further include a reflector covering at least a portion of the inverse parallel diode section. With the reflector disposed to cover the inverse parallel diode section, the light emitting diode chip has improved luminous efficacy.

The reflector may be a distributed Bragg reflector (DBR).

At least a portion of the reflector may extend to the light emitting diode section to insulate the second extension from a side surface of the light emitting diode section. In other words, the reflector may be disposed between the second extension and the side surface of the light emitting diode section. Furthermore, the reflector may extend to an upper side of the second conductivity type semiconductor layer of the light emitting diode section.

Furthermore, at least a portion of the reflector may extend to the light emitting diode section to insulate the first extension from the light emitting diode section. The first extension may be insulated from the second conductivity type semiconductor layer of the light emitting diode section by the reflector.

The reflector may cover the inverse parallel diode section so as to enclose the first electrode pad and may have an opening, through which the first conductivity type nitride semiconductor layer connected to the second extension is exposed. The reflector may cover substantially an overall region of the inverse parallel diode section except for the first electrode pad region and the opening.

In addition, the current blocking layer may be a distributed Bragg reflector (DBR).

At least one of the first and second extensions may include a reflective metal layer formed on an upper side thereof.

An exemplary embodiment of the present invention also discloses a light emitting diode chip including a substrate; a light emitting diode section disposed on the substrate; an inverse parallel diode section disposed on the substrate; a first electrode pad disposed on the inverse parallel diode section; a second electrode pad disposed on the light emitting diode section; a first extension extending from the first electrode pad and connected to the light emitting diode section; and a second extension extending from the second electrode pad and connected to the inverse parallel diode section. The inverse parallel diode section may be connected inversely parallel to the light emitting diode section. When the inverse parallel diode section is formed on a region on which the first electrode pad is formed, the light emitting diode chip exhibits high resistance to electrostatic discharge, while preventing a reduction in light emitting area.

An exemplary embodiment of the present invention also discloses a light emitting diode package including a chip mounting section having a chip mounting face and a light emitting diode chip mounted on the chip mounting face. The light emitting diode chip may include a substrate; a light emitting diode section disposed on the substrate; and an inverse parallel diode section disposed on the substrate and connected inversely parallel to the light emitting diode section. The light emitting diode chip may further include a reflector covering at least a portion of the inverse parallel diode section.

By adopting the light emitting diode chip, there is no need to mount a separate Zener diode inside the package, thereby preventing increase in optical loss or process cost due to mounting of the Zener diode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

FIG. 1 is a schematic plan view of a light emitting diode chip according to an exemplary embodiment of the present invention.

FIG. 2 is a schematic sectional view taken along line A-A of FIG. 1.

FIG. 3 is a schematic sectional view taken along line B-B of FIG. 1.

FIG. 4 is a schematic sectional view taken along line C-C of FIG. 1.

FIG. 5 is a schematic circuit diagram of a light emitting diode chip according to an exemplary embodiment of the present invention.

FIGS. 6 (a) and 6 (b) are schematic plan views of light emitting diode chips according to an exemplary embodiment of the present invention.

FIG. 7 is a graph depicting I-V characteristics of a typical light emitting diode chip and light emitting diode chips according to an exemplary embodiment of the present invention.

FIG. 8 is a sectional view of a light emitting diode chip according to an exemplary embodiment of the present invention.

FIG. 9 is a partial plan view of a light emitting diode chip according to an exemplary embodiment of the present invention.

FIG. 10 is a schematic sectional view taken along line D-D of FIG. 9.

FIG. 11 is a partial plan view of a light emitting diode chip according to an exemplary embodiment of the present invention.

FIG. 12 is a schematic sectional view taken along line E-E of FIG. 10.

FIG. 13 is a schematic sectional view taken along line F-F of FIG. 10.

FIG. 14 is a schematic sectional view of a light emitting diode package according to an exemplary embodiment of the present invention.

FIG. 15 is a schematic sectional view of a light emitting diode package according to an exemplary embodiment of the present invention.

DETAILED DESCRIPTION OF THE EXEMPLARY EMBODIMENTS

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. Further, it should be noted that the drawings are not to precise scale, and some of the dimensions, such as width, length, thickness, and the like, are exaggerated for clarity of description in the drawings. Like components are denoted by like reference numerals throughout the specification.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Referring to FIGS. 1 to 4, the light emitting diode chip includes a substrate 21, a light emitting diode section (Ld), and an inverse parallel diode section (Rd). Further, the light emitting diode chip may include a first transparent electrode layer 31a, a second transparent electrode layer 31b, a current blocking layer 33a, an insulation layer 33b, a first electrode pad 35, a second electrode pad 37, a first extension 35a, a second extension 37a, and an end portion 37b of the first extension 35a.

The substrate 21 allows growth of semiconductor epitaxial layers thereon, and may be, for example, a patterned sapphire substrate. As shown in FIGS. 2 to 4, the patterned sapphire substrate has a pattern of protrusions formed on a surface thereof to improve light extraction efficiency by scattering light at the protrusions.

The light emitting diode section (Ld) may include a first conductivity type nitride semiconductor layer 25a, an active layer 27a, and a second conductivity type nitride semiconductor layer 29a, and the inverse parallel diode section (Rd) may include a first conductivity type nitride semiconductor layer 25b, an active layer 27b, and a second conductivity type nitride semiconductor layer 29b. The light emitting diode section (Ld) and the inverse parallel diode section (Rd) are nitride-based stacked regions electrically separated from each other, and may be formed of nitride semiconductor layers. With this structure, the light emitting diode section (Ld) may be disposed to be coplanar with the inverse parallel diode section (Rd) on the same substrate.

The first conductivity type nitride semiconductor layers 25a, 25b may include, for example, n-type GaN, and the second conductivity type nitride semiconductor layers 29a, 29b may include, for example, p-type GaN, or vice versa. Each of the active layers 27a, 27b may be disposed between the first conductivity type nitride semiconductor layer 25a or 25b and the second conductivity type nitride semiconductor layer 29a or 29b, and may have a single quantum well structure or a multi-quantum well structure.

The light emitting diode section (Ld) and the inverse parallel diode section (Rd) may be formed by patterning nitride semiconductor layers grown by the same growth process, for example, MOCVD, MBE, and the like, to be separated from each other. Accordingly, the first conductivity type nitride semiconductor layer 25a, the active layer 27a and the second conductivity type nitride semiconductor layer 29a may be formed by the same process as that of the first conductivity type nitride semiconductor layer 25b, the active layer 27b and the second conductivity type nitride semiconductor layer 29b. Thus, the first conductivity type nitride semiconductor layer 25a, the active layer 27a and the second conductivity type nitride semiconductor layer 29a may have the same composition and the same impurity density as those of the first conductivity type nitride semiconductor layer 25b, the active layer 27b and the second conductivity type nitride semiconductor layer 29b.

The second conductivity type nitride semiconductor layer 29b may have a smaller thickness than the second conductivity type nitride semiconductor layer 29a. For example, the second conductivity type nitride semiconductor layer 29b may be a thin layer formed by dry etching. As a result, the inverse parallel diode section (Rd) may have a lower height than the light emitting diode section (Ld), thereby reducing absorption of light by the first electrode pad 35.

As shown in FIG. 1, the light emitting diode section (Ld) has a larger area than the inverse parallel diode section (Rd). The inverse parallel diode section (Rd) is formed in a narrow area in which an n-electrode pad is formed, in a typical lateral-type light emitting diode. Thus, there is no substantial reduction in light emitting area resulting from the formation of the inverse parallel diode section (Rd), so that the inverse parallel diode section (Rd) may be disposed in a single chip without reduction in light output or an increase in forward voltage.

The first transparent electrode layer 31a is disposed on the light emitting diode section (Ld). The first transparent electrode layer 31a covers an upper surface of the light emitting diode section (Ld). The first transparent electrode layer 31a electrically contacts the second conductivity type nitride semiconductor layer 29a, and allows electric current to spread over a wide area of the light emitting diode section (Ld). The second transparent electrode layer 31b is disposed on the inverse parallel diode section (Rd). The second transparent electrode layer 31b electrically contacts the second conductivity type nitride semiconductor layer 29b. Although the second transparent electrode layer 31b can be omitted, use of the second transparent electrode layer 31b provides better electrostatic discharge characteristics than the case where the second transparent electrode layer 31b is omitted. The first transparent electrode layer 31a and the second transparent electrode layer 31b may be formed by the same process using, for example, transparent conductive oxides, such as ITO, FTO, ZnO, and the like, or transparent metals such as Ni/Au, without being limited thereto. Furthermore, the second transparent electrode layer 31b may be formed of a different material than that of the first transparent electrode layer 31a, and the second transparent electrode layer 31b may be formed of an opaque material instead of a transparent material. Further, instead of the second transparent electrode layer 31b, an opaque electrode layer may be formed to make ohmic contact with the second conductivity type nitride semiconductor layer 29b.

The first electrode pad 35 is disposed on the inverse parallel diode section (Rd), and is electrically connected to the second conductivity type nitride semiconductor layer 29b. On the other hand, the second electrode pad 37 is disposed on the light emitting diode section (Ld) and is electrically connected to the second conductivity type nitride semiconductor layer 29a. The first electrode pad 35 and the second electrode pad 37 are formed to have relatively large areas to allow connection via bonding wires for supplying electric current to the light emitting diode chip. For example, the first electrode pad 35 and the second electrode pad 37 have a larger width than the first extension 35a or the second extension 37a, respectively.

The first extension 35a extends from the first electrode pad 35 and is electrically connected to the first conductivity type nitride semiconductor layer 25a of the light emitting diode section (Ld). As shown in FIG. 1, the first extension 35a may be connected to the first conductivity type nitride semiconductor layer 25a at a plurality of points (6 points are shown in FIG. 1). The first extension 35a may also pass through an upper portion of the light emitting diode section (Ld), that is, an upper portion of the second conductivity type nitride semiconductor layer 29a, and may be insulated from the second conductivity type nitride semiconductor layer 29a by the insulation layer 33b. Alternatively, the first extension 35a may be linearly connected to an upper surface of the first conductivity type nitride semiconductor layer 29a. For example, the first conductivity type nitride semiconductor layer 25a is consecutively exposed on a side surface of the light emitting diode section (Ld) by mesa etching, and the first extension 35a may be formed on an exposed region of the first conductivity type nitride semiconductor layer 29a. The first extension 35a is also insulated from the first conductivity type nitride semiconductor layer 25b of the inverse parallel diode section (Rd) by the insulation layer 33b.

The insulation layer 33b is disposed between the first extension 35a and the second conductivity type nitride semiconductor layer 29a to electrically insulate the first extension 35a from the second conductivity type nitride semiconductor layer 29a. Further, the insulation layer 33b may be disposed near the transparent electrode layers 31a, 3 lb to cover side surfaces of the light emitting diode section (Ld) and the inverse parallel diode section (Rd. As such, the first extension 35a and the second extension 37a may be insulated from the side surface of the light emitting diode section (Ld) and the side surface of the inverse parallel diode section (Rd).

The second extension 37a extends from the second electrode pad 37. The second extension 37a allows electric current to spread over a wide area of the light emitting diode section (Ld). The second extension 37a may extend in parallel to the first extension 35a to face each other. However, the present invention is not limited thereto, and the second extension 37a may extend in various ways. In addition, the second extension 37a also extends to the inverse parallel diode section (Rd) such that the end portion 37b of the second extension is electrically connected to the first conductivity type nitride semiconductor layer 25b.

As shown in FIG. 4, the end portion 37b of the second extension is electrically connected to the first conductivity type nitride semiconductor layer 25b of the inverse parallel diode section (Rd). The end portion 37b may be disposed on a region of the first conductivity type nitride semiconductor layer 25b exposed by mesa etching. Alternatively, the inverse parallel diode section (Rd) may be formed to have a generally slanted side surface, and the end portion 37b may be connected to a region of the first conductivity type nitride semiconductor layer 25b exposed to the slanted surface of the inverse parallel diode section (Rd). In this case, mesa etching may be omitted, thereby simplifying the manufacturing process.

On the other hand, as shown in FIG. 2, the current blocking layer 33a may be disposed below the second electrode pad 37. Further, the current blocking layer 33a is disposed between the first transparent electrode layer 31a and the second conductivity type nitride semiconductor layer 29a. The current blocking layer 33a may be formed of an insulating material, such as silicon oxide, silicon nitride, and the like. The current blocking layer 33a assists current spreading by preventing direct flow of electric current from the second electrode pad 37 to the second conductivity type nitride semiconductor layer 29a. The current blocking layer 33a may extend below the second extension 37a. Further, the current blocking layer 33a may extend to the inverse parallel diode section (Rd) side to insulate the second extension 37a from the first conductivity type nitride semiconductor layer 25a exposed to the side surface of the light emitting diode section (Ld). Alternatively, the insulation layer separated from the current blocking layer 33a may insulate the second extension 37a from the first conductivity type nitride semiconductor layer 25a exposed to the side surface of the light emitting diode section (Ld).

According to this exemplary embodiment, the inverse parallel diode section (Rd) is formed in an area in which the first electrode pad 35 is formed, thereby improving electrostatic discharge characteristics of the light emitting diode chip while suppressing reduction in light emitting area. Further, as shown in FIG. 5, the first extension 35a and the second extension 35b may be used to form an inverse parallel connection circuit in a single light emitting diode chip, in which the light emitting diode section (Ld) and the inverse parallel diode section (Rd) are connected to each other in inverse parallel.

FIGS. 6 (a) and 6(b) are schematic plan views of light emitting diode chips according to exemplary embodiments of the present invention. For simple illustration, the same components are denoted by the same reference numerals as those of FIG. 1.

Referring to FIG. 6(a), the light emitting diode chip is generally similar to the light emitting diode chip shown in FIG. 1, except for the relative location between the first electrode pad 35 and the second electrode pad 37, and design of the first extension 35a and the second extension 37a. That is, in the light emitting diode chip of FIG. 1, the first electrode pad 35 and the second electrode pad 37 are disposed at a first edge of the light emitting diode chip (at a side to which the second extension 37a is disposed adjacent), and the first extension 35a extends from the first electrode pad 35 to a second edge opposite the first edge. On the contrary, in the present exemplary embodiment, a first electrode pad 35 and a second electrode pad 37 are disposed in a diagonal direction, and a second extension 37a extends farther inside the light emitting diode section (Ld) than a first extension. Here, the second extension 37 has a T-shaped end portion 37b.

Referring to FIG. 6(b), the light emitting diode chip is similar to the light emitting diode chip of FIG. 6(a) except that a first extension 35a is linearly connected to a first conductive-type semiconductor layer 25a. Specifically, in this embodiment, the first extension 35a is disposed in a linear area, in which a second conductivity type semiconductor layer 29a and an active layer 27a are removed by mesa etching, and is consecutively connected to the first conductive-type semiconductor layer 25a.

The relative location between the first electrode pad 35 and the second electrode pad 37, and locations, shapes and structures of the first extension 35a and the second extension 37a may be arranged in various ways.

Light emitting diode chips P1, P2 according to FIG. 1 and FIG. 6(a) were manufactured and evaluated as to electrical and optical characteristics, together with a typical light emitting diode chip (Ref). FIG. 7 shows I-V characteristics of these light emitting diode chips.

Referring to FIG. 7, when inverse electric current is applied to the typical light emitting diode chip (Ref), the electric current does not substantially flow therethrough. Although not shown in the graph, when inverse voltage is increased by 10V or more, breakdown of the light emitting diode chip occurs.

In the light emitting diode chips P1, P6 of FIG. 1 and FIG. 6(a), it can be seen that the inverse parallel diode section (Rd) was turned on and current flows therethrough, as inverse voltage increases.

On the other hand, results of forward voltage (at 20 mA), light output (at 20 mA) and electrostatic discharge (ESD) yield at an inverse voltage of 3 kV of the light emitting diode chips Ref, P1, P2 are summarized in Table 1. For a light emitting diode chip having a typical epitaxial layer structure and an ESD-enhanced light emitting diode chip including a super lattice layer between an active layer and a first conductivity type nitride semiconductor layer for enhancement of ESD, the typical light emitting diode chip (Ref), the light emitting diode chip P1 of the first exemplary embodiment and the light emitting diode chip (P2) of the second exemplary embodiment were manufactured and evaluated as to the above characteristics. Results are shown in Table 1.

TABLE 1

| Epitaxy structure | Chip structure | Forward voltage V (@20 mA) | Light output W (@20 mA) | ESD yield (@3 kV) |
|---|---|---|---|---|
| Typical epitaxy | Ref | 2.93 | 77.3 | 4% |
|  | P1 | 2.94 | 76.8 | 99% |
|  | P2 | 2.92 | 75.9 | 100% |
| ESD-enhanced epitaxy | Ref | 2.90 | 80.4 | 83% |
|  | P1 | 2.93 | 79.2 | 99% |
|  | P2 | 2.90 | 78.9 | 99% |

Referring to Table 1, as compared with the typical light emitting diode chip, the light emitting diode chips P1, P2 did not exhibit substantial variation in forward voltage, and did not suffer from significant reduction of light output. On the contrary, in terms of ESD yield, the light emitting diode chips P1, P2 exhibited more significantly improved results than the light emitting diode chip of the prior art (Ref). Both the typical epitaxy structure and the ESD-enhanced epitaxy structure provided significantly improved ESD yield. Particularly, the typical epitaxy structure vulnerable to ESD exhibited a high ESD yield of 99% or more.

FIG. 8 is a sectional view of a light emitting diode chip according to a an exemplary embodiment of the present invention. For reference, FIG. 8 corresponds to the sectional view (FIG. 4) taken along line C-C of FIG. 1.

Referring to FIG. 8, the light emitting diode chip is generally similar to the light emitting diode chip described with reference to FIGS. 1 to 4, except that a portion of a first electrode pad 35 is disposed above an end portion 37b of a first extension. Specifically, at least a portion of the end portion 37b of the first extension connected to a first conductivity type nitride semiconductor layer 25b in an inverse parallel diode section (Rd) is disposed below the first electrode pad 35. The end portion 37b of the first extension is insulated from the first electrode pad 35 by an insulation layer 39.

According to this exemplary embodiment, since it is not necessary to separate the first electrode pad 35 from the end portion 37b in the horizontal direction, it is possible to provide a light emitting diode chip in which the inverse parallel diode section (Rd) has a relatively small size and the first electrode pad 35 has the same area as that of the light emitting diode chips according to the previously described exemplary embodiments. In addition, as can be seen from comparison of the light emitting diode chip according to the exemplary embodiment as shown in FIG. 8 with the light emitting diode chip according to the exemplary embodiment as shown in FIG. 4, the size of the light emitting diode section (Ld) may be increased while decreasing the size of the inverse parallel diode section (Rd). As a result, it is possible to minimize reduction in light emitting area of the light emitting diode section (Ld) while forming the inverse parallel diode section (Rd) in a single light emitting diode chip.

FIG. 9 is a schematic partial plan view of a light emitting diode chip according to an exemplary embodiment of the invention, and FIG. 10 is a sectional view taken along line D-D of FIG. 9. In the plan view of FIG. 9, the inverse parallel diode section (Rd) and a portion of the light emitting diode section (Ld) around the inverse parallel diode section (Rd) of FIG. 1 are enlarged.

Referring to FIGS. 9 and 10, the light emitting diode chip is generally similar to the light emitting diode chip described with reference to FIGS. 1 to 4 except that the light emitting diode chip includes reflectors 133a, 133b.

The reflectors 133a, 133b may be distributed Bragg reflectors formed of an insulation layer. The DBR structure may be formed by alternately stacking dielectric layers having different indexes of refraction. For example, the DBR structure may be formed by repeatedly stacking $TiO_2$/$SiO_2$, $Nb_2O_5$/$SiO_2$ or $HfO_2$/$SiO_2$. In addition, the DBR structure can maximize reflection through a thin film design adapted for central wavelengths in consideration of spectrum distribution of light to be reflected, thereby preventing optical loss resulting from absorption of light upon use of a single film of $SiO_2$ and the like.

The reflector 133a is disposed between the second extension 37a and the light emitting diode section (Ld), and insulates the second extension 37a from a side surface of the light emitting diode section (Ld). In addition, the reflector 133a may act as the current blocking layer 33a described with reference to FIGS. 1 to 4. For example, similar to the current blocking layer 33a, the reflector 133a may be disposed between the first transparent electrode layer 31a and the second conductivity type nitride semiconductor layer 29a under the second electrode pad 37 and the second extension 37a. Furthermore, the reflector 133a may cover a portion of the inverse parallel diode section (Rd). For example, as shown in FIG. 9, the reflector 133a may cover a portion of the first conductivity type nitride semiconductor layer 25b of the inverse parallel diode section (Rd).

In other words, the reflector 133a covers a portion of the inverse parallel diode section (Rd), and may extend to the light emitting diode section (Ld) to insulate the second extension 37a from the side surface of the light emitting diode section (Ld).

On the other hand, the reflector 133b covers a portion of the inverse parallel diode section (Rd) and extends to the light emitting diode section (Ld) to insulate the first extension 35a from the second conductivity type nitride semiconductor layer 29a of the light emitting diode section (Ld). Namely, in the structure wherein the first extension 35a passes through an upper portion of the light emitting diode section (Ld), the reflector 133b is disposed between the first extension 35a and the second conductivity type nitride semiconductor layer 29a to prevent short circuits between the first extension 35a and the second conductivity type nitride semiconductor layer 29a. In addition, the first extension 35a is electrically insulated from the first transparent electrode layer 31a.

Further, as shown in FIG. 9, the reflector 133b insulates the first extension 35a from the side surface of the inverse parallel diode section (Rd) and the side surface of the light emitting diode section (Ld) by covering the side surfaces of the inverse parallel diode section (Rd) and the light emitting diode section (Ld). The reflector 133a may act as the insulation layer 33b described with reference to FIGS. 1 to 4.

The reflectors 133a, 133b prevent optical loss resulting from absorption of light by the first extension 35a and the second extension 37a when light is emitted from the light emitting diode section (Ld). Specifically, some of the light emitted from the light emitting diode section (Ld) is directed towards the first extension 35a and the second extension 37a, and is reflected by the reflectors 133a, 133b to return into the light emitting diode section (Ld). Thereafter, the reflected light can be emitted outside through other portions of the light emitting diode section (Ld).

In this exemplary embodiment, at least one of the first extension 35a and the second extension 37a may further include a reflective metal layer 137 formed on upper side(s) thereof, as shown in FIG. 10. The reflective metal layer 137 reduces optical loss by reflecting light entering upper side(s) of the first extension 35a and/or the second extension 37a. For example, when light emitted from the light emitting diode section (Ld) is incident on the first extension 35a and/or the second extension 37a disposed on the inverse parallel diode section (Rd), the reflective metal layer 137 reflects the light. The reflective metal layer 137 may be formed of, for example, Ni, Al, Ag, Rh, Pt, or combinations thereof.

FIG. 11 is a partial plan view of a light emitting diode chip according to an exemplary embodiment of the present invention, and FIGS. 12 and 13 are sectional views taken along line E-E and line F-F of FIG. 11, respectively.

Referring to FIGS. 11 to 13, the light emitting diode chip is generally similar to the light emitting diode chip described with reference to FIGS. 9 and 10, except that the light emitting diode chip further includes a reflector 133r. The reflector 133r may be formed of the same material as that of the reflectors 133a, 133b and by the same process.

The reflector 133r covers an inverse parallel diode section (Rd) so as to enclose a first electrode pad 35. The reflector 133r has an opening 133h, through which a first conductivity type nitride semiconductor layer 25b connected to an end portion 37b of a second extension 37a is exposed.

As shown in FIG. 13, the reflector 133r may cover substantially an entire area of a second conductivity type nitride semiconductor layer 29b around the first electrode pad 35. In addition, the reflector 133r may cover a side surface of the inverse parallel diode section (Rd).

The reflector 133r may reflect light emitted from a light emitting diode section (Ld) and travelling towards the inverse parallel diode section (Rd), thereby preventing the light from re-entering the inverse parallel diode section (Rd). Furthermore, as described below, the reflector 133r may reflect light entering the inverse parallel diode section (Rd) from a molding section or phosphors of a light emitting diode package, thereby improving luminous efficacy.

FIG. 14 is a sectional view of a light emitting diode package according to yet another embodiment of the present invention.

Referring to FIG. 14, the light emitting diode package includes a chip mounting member 110 having a chip mounting face, a light emitting diode chip 100, at least two leads 111, 113, and bonding wires 115.

For the chip mounting member 110, any member may be used which can mount the light emitting diode chip 100 thereon. For example, the chip mounting member 110 may be a lead frame type package body, a printed circuit board, and the like. The light emitting diode chip 100 may be the light emitting diode chip described with reference to FIGS. 1 to 4, the light emitting diode chip described with reference to FIG. 6, the light emitting diode chip described with reference to FIGS. 9 and 10, or the light emitting diode chip described with reference to FIGS. 11 to 13, and detailed descriptions thereof will be omitted.

The first electrode pad 35 and the second electrode pad 37 of the light emitting diode chip are electrically connected to the leads 111, 113 via the bonding wires 115.

FIG. 15 is a sectional view of a light emitting diode package according to an exemplary embodiment of the present invention.

Referring to FIG. 15, the light emitting diode package includes a chip mounting member 110 having a chip mounting face and a light emitting diode chip 100. In addition, the light emitting diode package may include at least two leads 111, 113, bonding wires 115, and a molding section 117. The light emitting diode package may further include a wavelength converter (not shown).

The light emitting diode package according to FIG. 15 is generally similar to the light emitting diode package according to the exemplary embodiment shown in FIG. 14, except that the light emitting diode package according to the present embodiment includes the molding section 117 and the wavelength converter. Hereinafter, the light emitting diode package according to the present embodiment will be described in more detailed with regard to different components, and repeated descriptions of the components will be omitted.

The molding section 117 covers the light emitting diode chip 100. The molding section 117 may contain phosphors and, thus, may act as a wavelength converter. Alternatively, a separate wavelength converter independent of the molding section 117 may be disposed on the molding section 117 or on the light emitting diode chip 100. The wavelength converter converts wavelengths of light emitted from the light emitting diode chip 100.

Light emitted from the light emitting diode chip 100 enters the molding section 117, and some of the light entering the molding section 117 is directed again towards the light emitting diode chip 100. Particularly, when a wavelength converter including phosphors is used, some of light subjected to wavelength conversion by the wavelength converter may be directed towards the light emitting diode chip 100. In this case, in the light emitting diode chips described with reference to FIGS. 11 to 13, light is reflected by the reflector 133r covering substantially the overall area of the inverse parallel diode section (Rd), thereby improving the luminous efficacy of the package.

In order to evaluate ESD characteristics at the package level of light emitting diode chips according to examples of the present invention, light emitting diode chips having passed ESD testing at 3 kV at the chip level were evaluated as to ESD characteristics at the package level. Each of the light emitting diode chips used in this evaluation had an ESD-enhanced epitaxy structure, which includes a super lattice layer between the active layer and the first conductivity type nitride semiconductor layer for enhancement of ESD characteristics, and had the same structure as that of the light emitting diode chip according to the exemplary embodiment (P1) shown in FIG. 1. Here, the light emitting diode chip of Example 1 did not include the second transparent electrode layer 31b, and the light emitting diode chip of Example 2 employed indium tin oxide (ITO) as the second transparent electrode layer 31b. For twenty test packages of each of Examples 1 and 2, ESD yield was measured while increasing ESD testing voltage from 1 kV to 4 kV. Results are shown in Table 2.

TABLE 2

|  | ESD Yield | | | |
| --- | --- | --- | --- | --- |
|  | @1 kV | @2 kV | @3 kV | @4 KV |
| Example 1 | 100% | 100% | 85% | 0% |
| Example 2 | 100% | 100% | 100% | 100% |

Referring to Table 2, it can be seen that, when the second transparent electrode layer 31b was not included, device failure occurred due to electrostatic discharge at 3 kV or higher. On the contrary, when the second transparent electrode layer 31b was used, there was no device failure even at 4 kV. As a consequence, it can be seen that the second transparent electrode layer 31b enhances ESD characteristics.

According to the present invention, because the light emitting diode chip 100 includes the inverse parallel diode section (Rd), there is no need for a separate protective device for prevention of electrostatic discharge, for example, a Zener diode, in a light emitting diode package. Accordingly, the present invention may simplify a manufacturing process through elimination of a process for mounting the Zener diode, and may improve luminous efficacy of the package by preventing absorption of light by the Zener diode. Furthermore, the light emitting diode chip according to the present invention includes the reflector 133r to reduce re-absorption of light into the light emitting diode chip 100, thereby improving luminous efficacy.

In the light emitting diode chip according to the present invention, the light emitting diode section and the inverse parallel diode section are formed on the same substrate, whereby the light emitting diode chip exhibits high resistance to electrostatic discharge and does not need a separate ESD protection device, such as a Zener diode.

In addition, the inverse parallel diode section is formed on the region of the first electrode pad, thereby preventing reduction in the light emitting area. As a result, the light emitting diode chip may adopt an inverse-parallel diode arrangement without suffering from a decrease in light output or increase in forward voltage.

Furthermore, in the light emitting diode chip according to the present invention, a portion of the first electrode pad is disposed on the second extension, thereby enabling reduction in size of the inverse parallel diode section without reducing the size of the electrode pad. As a result, it is possible to prevent decrease in light emitting area of the light emitting diode section even when the inverse parallel diode section is formed.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting diode chip comprising:
    a substrate having a first and a second surface;
    a light emitting diode disposed over the first surface of the substrate, the light emitting diode located between a first exterior edge and a second exterior edge of the substrate that are opposite to each other and extend in a longitudinal direction of the light emitting diode chip, wherein the light emitting diode comprises;
        a first conductivity type nitride semiconductor layer; one or more stack structure including a second conductivity type nitride semiconductor layer, and an active layer disposed between the first conductivity type nitride semiconductor layer and the second conductivity type nitride semiconductor layer, wherein the light emitting diode operates to emit light from the active layer in a direction away from the first surface of the substrate;
        a first electrode pad disposed over the first conductivity type nitride semiconductor layer;
        a transparent electrode layer disposed over the second conductivity type nitride semiconductor layer;
        a second electrode pad disposed over the transparent electrode layer; a first extension extending from the first electrode pad and having no contact with the second electrode pad, the first extension extending in the longitudinal direction and positioned closer to the first exterior edge than the second exterior edge and a second extension; and the second extension extending from the second electrode pad and having no contact with the first electrode pad, the second extension extending in the longitudinal direction and positioned closer to the second exterior edge than the first exterior edge and the first extension, wherein the first extension includes first extension portions in electrical contact with the first conductivity type nitride semiconductor layer and second extension portions not in electrical contact with the first conductivity type nitride semiconductor, and the first extension portions are closer to the first exterior edge than any of the one or more stack structure is.

2. The light emitting diode chip of claim 1, further comprising an insulation layer disposed between the first extension and the first conductivity type nitride semiconductor layer of the light emitting diode to electrically insulate the first extension from the second conductivity type nitride semiconductor layer.

3. The light emitting diode chip of claim 2, wherein the insulation layer is disposed to cover a side surface of the light emitting diode such that the first extension and the second extension are insulated from the side surface of the light emitting diode.

4. The light emitting diode chip of claim 2, wherein the insulation layer has a greater width than the first extension.

5. The light emitting diode chip of claim 4, wherein the insulation layer is not overlaid with the transparent electrode layer and contact to the first semiconductor layer.

6. The light emitting diode chip of claim 2, wherein the insulation layer is disposed near the transparent electrode layer to cover a portion of a side surface of the light emitting diode.

7. The light emitting diode chip of claim 1, wherein the first electrode pad and the second electrode pad have a greater width than the first extension and the second extension, respectively.

8. The light emitting diode chip of claim 7, wherein the first extension portions include a first exposed region and a second exposed region on a side surface of the light emitting diode; and wherein a distance of one of the first exposed region and the second exposed region is shorter than a distance between the first exposed region and the second exposed region.

9. The light emitting diode chip of claim 1, wherein the first extension passes through a portion of the second conductivity type nitride semiconductor layer of the light emitting diode.

10. The light emitting diode chip of claim 1, wherein at least one of the first extension and the second extension is disposed along the edge of the light emitting diode chip.

11. The light emitting diode chip of claim 1, further comprising a current blocking layer formed below the second electrode pad and between the transparent electrode layer and the second conductivity type nitride semiconductor layer of the light emitting diode.

12. The light emitting diode chip of claim 1, wherein the second extension extends in parallel to the first extension.

13. The light emitting diode chip of claim 1, wherein the first surface of the substrate includes a pattern of protrusions; and wherein the pattern of protrusions are located under the discrete locations.

14. The light emitting diode chip of claim 1, wherein the first surface of the substrate includes a light scattering structure.

15. The light emitting diode chip of claim 1, wherein the substrate includes a patterned sapphire substrate.

16. The light emitting diode chip of claim 1, wherein the first extension portions are formed in a first exposed portion and a second exposed portion of the first conductivity type semiconductor layer, the first exposed portion and the second exposed portions formed on a side surface of the light emitting diode, and wherein one of the first exposed region and the second exposed region has a size smaller than a distance between the first exposed region and the second exposed region.

17. A light emitting diode chip comprising:
a substrate including a patterned surface;
a light emitting diode section disposed over the patterned surface of the substrate; and
an inverse parallel diode section formed over the patterned surface of the substrate and inversely parallel to the light emitting diode section, each of the light emitting diode section and the inverse parallel diode section including a first conductivity type semiconductor layer; a second conductivity type semiconductor layer; and an active layer disposed between the first conductivity type semiconductor layer and the second conductivity type semiconductor layer;
a first electrode pad disposed over the inverse parallel diode section and electrically connected to the second conductivity type semiconductor layer of the inverse parallel diode section;
a second electrode pad disposed over the light emitting diode section and electrically connected to the second conductivity type semiconductor layer of the light emitting diode section;
a first extension extending from the first electrode pad along one side of the light emitting diode chip and having no contact with the second electrode pad, the first extension includes first extension portions electrically connected to the first conductivity type semiconductor layer of the light emitting diode section and second extension portions not electrically connected with the first conductivity type semiconductor layer of the light emitting diode section, one of the first extension portions and one of the second extension portions are alternately arranged along an edge of the light emitting diode; and
a second extension extending from the second electrode pad and having no contact with the first electrode pad, the second extension electrically connected to the first conductivity type semiconductor layer of the inverse parallel diode section.

18. The light emitting diode chip of claim 17, further comprising:
a transparent electrode layer formed over at least one of the light emitting diode section or the inverse parallel diode section to cover an upper surface of the light emitting diode section or the inverse parallel diode section.

19. The light emitting diode chip of claim 17, further comprising an insulation layer disposed over the second conductivity type semiconductor layer of the light emitting diode section and abutting a side surface of the transparent electrode layer.

20. The light emitting diode chip of claim 17, wherein the light emitting diode section has a greater size than the inverse parallel diode section.

21. The light emitting diode chip of claim 17, wherein the second conductivity type semiconductor layer of the inverse parallel diode section has a smaller thickness than the second conductivity type semiconductor layer of the light emitting diode section.

22. The light emitting diode chip of claim 17, wherein the inverse parallel diode section has a lower height than the light emitting diode section.

23. The light emitting diode chip of claim 17, wherein the first conductivity type semiconductor layer includes n-type GaN and the second conductivity type semiconductor layer includes p-type GaN.

24. The light emitting diode chip of claim 17, wherein the first extension and the second extension are insulated from side surfaces of the light emitting diode section and the inverse parallel diode section.

25. The light emitting diode chip of claim 17, wherein the second extension extends to the inverse parallel diode section such that an end portion of the second extension is electrically connected to the first conductivity type semiconductor layer of the inverse parallel diode section.

26. The light emitting diode chip of claim 17, wherein the second extension extends in parallel to the first extension.

27. The light emitting diode chip of claim 17, wherein the first extension and the second extension form an inverse parallel connection circuit and the light emitting diode section and the inverse parallel diode section are connected to each other in inverse parallel manner.

28. The light emitting diode chip of claim 17, wherein the first extension is connected to the first conductivity type semiconductor layer at discrete locations.

* * * * *